US006703273B2

(12) United States Patent
Wang et al.

(10) Patent No.: US 6,703,273 B2
(45) Date of Patent: Mar. 9, 2004

(54) AGGRESSIVE CAPACITOR ARRAY CELL LAYOUT FOR NARROW DIAMETER DRAM TRENCH CAPACITOR STRUCTURES VIA SOI TECHNOLOGY

(75) Inventors: Hsiao-Lei Wang, Tainan (TW); Chao-Hsi (Jesse) Cheng, Chu-pei (TW); Hung-Kwei Liao, Hsinchu (TW)

(73) Assignee: ProMos Technologies, Inc., Hsin-Chu (TW)

( * ) Notice: Subject to any disclaimer, the term of this patent is extended or adjusted under 35 U.S.C. 154(b) by 111 days.

(21) Appl. No.: 10/043,477

(22) Filed: Jan. 11, 2002

(65) Prior Publication Data

US 2003/0134468 A1 Jul. 17, 2003

(30) Foreign Application Priority Data

Jun. 4, 2001 (CN) .......................................... 90113482 A (51) Int. Cl.[7] .......................................... H01L 21/8242
(52) U.S. Cl. ...................................... 438/243; 438/244
(58) Field of Search ............................ 277/301, 306; 438/243, 244, 246, 249, 251

(56) References Cited

U.S. PATENT DOCUMENTS

| 5,627,092 | A | * | 5/1997 | Alsmeier et al. | ............ | 438/152 |
|---|---|---|---|---|---|---|
| 5,631,186 | A | * | 5/1997 | Park et al. | .................. | 438/155 |
| 5,731,609 | A | | 3/1998 | Hamamoto et al. | ......... | 257/302 |
| 5,895,946 | A | | 4/1999 | Hamamoto et al. | ......... | 257/302 |
| 5,914,510 | A | * | 6/1999 | Hieda | ......................... | 257/301 |
| 5,939,745 | A | * | 8/1999 | Park et al. | .................. | 257/304 |
| 5,968,840 | A | * | 10/1999 | Park et al. | .................. | 438/396 |
| 6,020,091 | A | | 2/2000 | Lee | ................................ | 430/5 |
| 6,121,651 | A | | 9/2000 | Furukawa et al. | .......... | 257/296 |
| 6,163,045 | A | | 12/2000 | Mandelman et al. | ....... | 257/301 |
| 6,174,784 | B1 | * | 1/2001 | Forbes | ....................... | 438/405 |
| 6,236,079 | B1 | * | 5/2001 | Nitayama et al. | ........... | 257/306 |
| 6,350,653 | B1 | * | 2/2002 | Adkisson et al. | ........... | 438/258 |
| 6,544,837 | B1 | * | 4/2003 | Divakauni et al. | .......... | 438/243 |
| 6,544,862 | B1 | * | 4/2003 | Bryan | ........................ | 438/455 |
| 2003/0096460 | A1 | * | 5/2003 | Nakajima et al. | ........... | 438/149 |

OTHER PUBLICATIONS

Silicon Processing, vol. 1, pp. 543–549, by Stanley Wolf and R.N. Tauber, Copyright 1986.*
Silicon Processing, vol. 1, p. 264, by Stanley Wolf and R.N. Tauber, Copyright 1986.*

* cited by examiner

Primary Examiner—Carl Whitehead, Jr.
Assistant Examiner—William Vesperman
(74) Attorney, Agent, or Firm—George O. Saile; Stephen B. Ackerman (57) ABSTRACT

A method of increasing DRAM cell capacitance via formation of deep, wide diameter trench capacitor structures, has been developed. An underlying semiconductor substrate is used to accommodate deep, wide diameter trench capacitor structures while an overlying, bonded, thinned semiconductor substrate is used to accommodate narrow diameter trench structures, in turn used for communication to the underlying deep trench capacitor structures, as well as to accommodate the elements of the DRAM device, such as the transfer gate transistors. The use of an underlying semiconductor substrate for accommodation of the trench capacitor structures allows a wider diameter structures to be used, thus reducing patterning difficulties encountered when forming narrow diameter, deep trench capacitor structures.

27 Claims, 8 Drawing Sheets

AGGRESSIVE CAPACITOR ARRAY CELL LAYOUT FOR NARROW DIAMETER DRAM TRENCH CAPACITOR STRUCTURES VIA SOI TECHNOLOGY

BACKGROUND OF THE INVENTION (1) Field of the Invention

The present invention relates to methods used to fabricate semiconductor devices and more specifically to a method used to achieve the desired capacitance for DRAM devices using trench capacitor structures featuring narrow diameters.

(2) Description of Prior Art

The advent of micro-miniaturization, or the ability to fabricate semiconductor devices with sub-micron features, has allowed device performance to be increased, while decreasing fabrication costs. Smaller device features allow performance degrading junction capacitances to be reduced, while a greater number of smaller semiconductor chips can now be obtained from a specific size starting substrate, thus reducing the fabrication cost for a specific semiconductor chip. One area in which micro-miniaturization has presented difficulties is with the use of trench capacitor structures, for dynamic random access memory (DRAM), devices. To supply the desired signal the capacitance of the DRAM trench capacitor has to be maximized. To continually satisfy designs demanding increased capacitance, the depth of the trench shape has to be increased. In addition to satisfy device or cell density, the trench shape is designed with diameters as narrow as 0.10 um. The combination of deep trenches and narrow diameters result in difficulties when attempting to define this combination using dry etching and post-clean procedures. Anisotropic reactive ion etching (RIE), procedures can be limited when defining a narrow diameter trench shape, at depths greater than about 6 to 10 um. The reactants and by-products of the RIE procedure can be difficult to remove from the large aspect ratio opening, thus interfering with the ability to define a deep, narrow diameter trench shape. In addition post-clean procedures may be not be able to completely remove the by-products and contaminants from the large aspect ratio trench shape opening, thus presenting difficulties when forming a capacitor dielectric layer on the exposed surface of the trench opening. The capacitor dielectric, or node layer, can be formed with inadequate dielectric characteristics, in the large aspect ratio trench opening, resulting in yield loss or reliability problems for the trench capacitor DRAM device.

This invention will describe a process in which the desired capacitance values, using trench capacitors, can be obtained for DRAM designs, however without the process difficulties presented wit deep, narrow diameter openings. This is accomplished via a novel process sequence using silicon on insulator (SOI), bonding procedures, in which a deep, wide diameter trench capacitor structure is formed in an underlying semiconductor substrate, while an overlying semiconductor substrate, featuring a connecting narrow trench shape, is bonded to the underlying semiconductor structure, allowing communication to the deep, wide diameter capacitor structure to be realized. This configuration allows sub-micron features to be employed for the DRAM trench shape and transfer gate transistor, in a portion of the overlying bonded wafer, while the capacitance requirement is satisfied using the deep, wide diameter trench shape, located in the underlying semiconductor substrate. Prior art, such as Mandelman et al, in U.S. Pat. No. 6,163,045, describe the fabrication of a DRAM device featuring a trench capacitor structure, however that prior art does not describe the novel process sequence supplied in this present invention in which the trench capacitance is satisfied via formation of a deep, wide diameter trench capacitor structure in an underlying semiconductor substrate while an overlying SOI type bonded wafer is used to accommodate a connecting, shallow, narrow diameter trench shape, as well as to accommodate the transfer gate transistor.

SUMMARY OF THE INVENTION

It is an object of this invention to fabricate a DRAM cell, featuring trench capacitor structures.

It is another object of this invention to form deep, wide diameter trench capacitor structures in an underlying semiconductor substrate.

It is still another object of this invention to form narrow diameter trench shapes in an overlying semiconductor substrate, bonded to an underlying semiconductor substrate, via silicon on insulator (SOI), procedures, and with the narrow diameter trench shape overlying and contacting the underlying, deep, wide diameter trench capacitor structures located in the underlying semiconductor substrate.

In accordance with the present invention a method of forming a DRAM cell in which the capacitance of a DRAM device is increased by forming a deep, wide diameter trench capacitor structure in an underlying semiconductor substrate, contacted by an overlying narrow diameter, polysilicon filled trench shape, located in an overlying semiconductor substrate, bonded to the underlying semiconductor substrate via SOI procedures, is described. Deep, wide diameter trench shapes are formed in a first semiconductor substrate, followed by formation of a buried plate region, surrounding the deep, wide diameter trench shapes. After forming a dielectric node layer on the surfaces of the deep, wide diameter trench shapes, deposition of in situ doped polysilicon followed by a chemical mechanical procedure, are used to form deep, wide diameter trench capacitor structures in the first semiconductor substrate. A second semiconductor substrate is then subjected to a splitting ion implantation procedure, then bonded to the underlying first semiconductor substrate via SOI bonding procedures. After polishing back the top portion of the second semiconductor substrate to a level in which the splitting ion implanted region is exposed, dielectric layers are deposited followed by the definition of narrow diameter trench shapes, in the dielectric layer and in the thinned, second semiconductor substrate, exposing a portion of the top surface of the deep, wide diameter capacitor trench structures. Formation of a collar layer on the sides of the narrow diameter trench shapes is followed by deposition of, and recessing of, an in situ doped polysilicon layer. After removal of exposed portions of the collar layer, another in situ doped polysilicon layer is deposited, resulting in a narrow diameter trench structure, located in the thinned, second semiconductor substrate, overlying and contacting a portion of the top surface of the deep, wide diameter capacitor trench structure, located in the underlying, first semiconductor substrate. Formation of transfer gate transistor elements, word line and bit line structures complete the fabrication of a DRAM cell, employing high capacitance trench structures located in an underlying semiconductor substrate, and employing contacting, narrow diameter trench structures, and transfer gate transistor elements, located in an overlying second semiconductor substrate.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
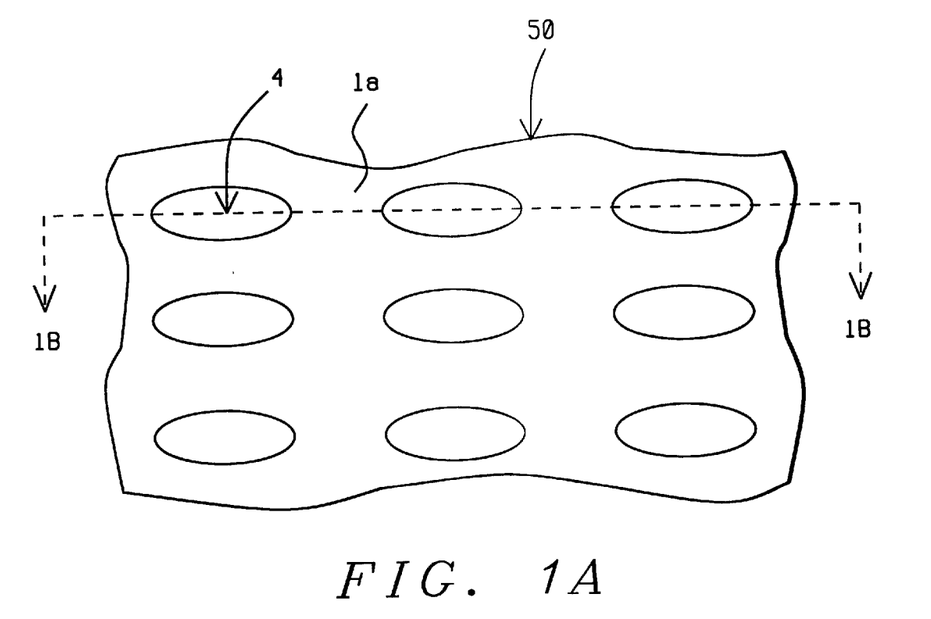
FIGS. 1A and 11A, which schematically show the top view of the DRAM cell described in this invention, at a significant stages of fabrication.
Figure 1B:
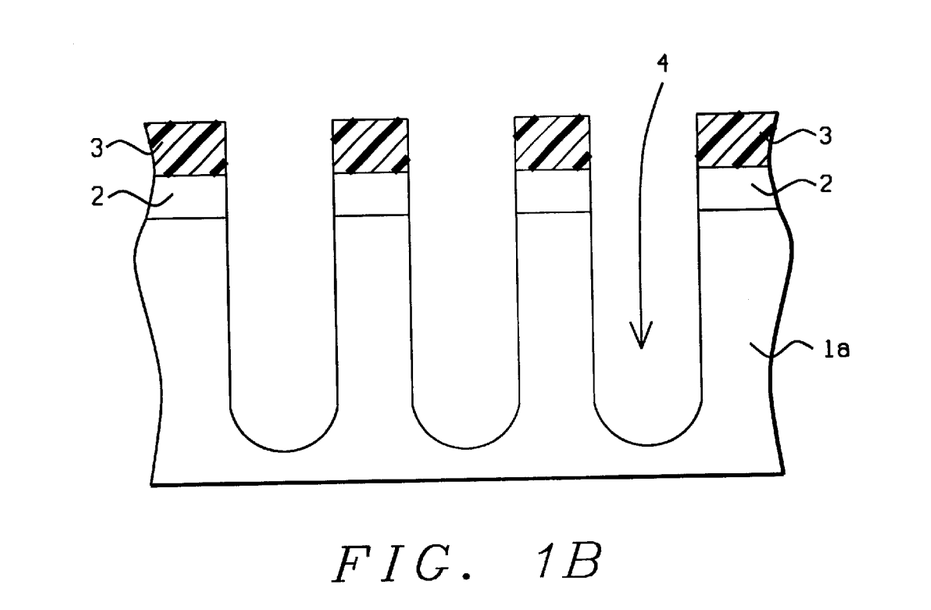
FIGS. 1B, 2–10, and 11B, which schematically, in cross sectional style, describe key stages of fabrication used to form a DRAM cell featuring deep, wide diameter capacitor trench structures, located in an underlying semiconductor substrate, connected to narrow diameter capacitor trench structures, located in an overlying, bonded, second semiconductor substrate.

The method of forming a DRAM cell featuring deep, wide diameter capacitor trench structures, located in an underlying semiconductor substrate, connecting to narrow diameter capacitor trench structures, located in an overlying, bonded, second semiconductor substrate, will now be described in detail. A P type semiconductor substrate 1$a$, comprised of single crystalline silicon, featuring a <100> crystallographic orientation, is used and schematically shown in cross-sectional style in FIG. 1B. A boro-phosphosilicate glass (BPSG) layer 2, is next deposited via plasma enhanced chemical vapor deposition (PECVD), or via low pressure chemical vapor deposition (LPCVD) procedures, at a thickness between about 8000 to 12000 Angstroms. After deposition of an anti-reflective coating (ARC) layer, not shown in the drawings, photoresist shape 3, is formed and used as an etch mask to define deep, wide diameter trench shapes 4, in both BPSG layer 2, and in semiconductor substrate 1$a$. Deep, wide diameter trench shapes 4, are defined via an anisotropic, reactive ion etching (RIE), procedure, using $CHF_3$ as an etchant for BPSG layer 2, while using $Cl_2$ or $SF_6$ as an etchant for silicon. Deep, wide diameter trench shapes 4, comprised with a length between about 0.25 to 0.35 um, and with a width of between about 0.15 to 0.25 um. Of equal importance deep, wide diameter trench shapes 4, are defined to a depth between about 6.5 to 7.5 um, in semiconductor substrate 1$a$. The depth of deep, wide diameter trench shape 4, when employed for the trench capacitor structure, will provide the surface area needed to allow the desired DRAM capacitance to be realized, while the relaxed horizontal dimensions allow an anisotropic RIE procedure to reach the desired trench shape depth. If narrower diameter trench shapes were attempted to be defined at this depth, ineffective RIE and post-clean procedures may have occurred, resulting in poorly defined trench shapes. The result of the definition of the deep, wide diameter trench shapes is schematically shown, in cross-sectional style, in FIG. 1B, while FIG. 1A, schematically shows a top view of DRAM cell 50, comprised at this stage of fabrication of numerous deep, wide diameter trench shapes 4.

Figure 2:
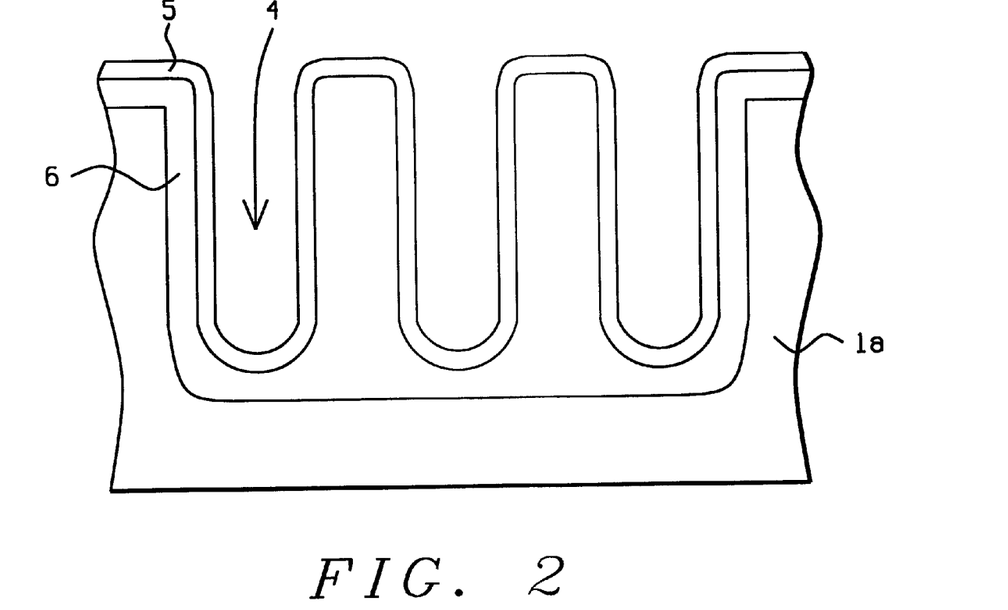

After removal of photoresist shape 3, via plasma oxygen ashing procedures, BPSG layer 2, is removed via wet chemical procedures. Deposition of arsenic silica glass (ASG), layer 5, is next accomplished at a thickness between about 250 to 400 Angstroms, via LPCVD or PECVD procedures, conformally coating all exposed surfaces of deep, wide diameter trench shapes 4. An anneal procedure is then used to drive arsenic from ASG layer 5, into adjacent regions of semiconductor substrate 1$a$, resulting in the formation of N type, buried plate region 6, located surrounding deep, wide diameter trench shapes 4. The anneal procedure is performed at a temperature between about 950 to 1050° C., followed by complete removal of the ASG layer via use of wet chemical procedures. N type buried plate region 6, will be used as one plate of a subsequent capacitor structure. The result of these procedures is schematically shown in FIG. 2.

Figure 3:
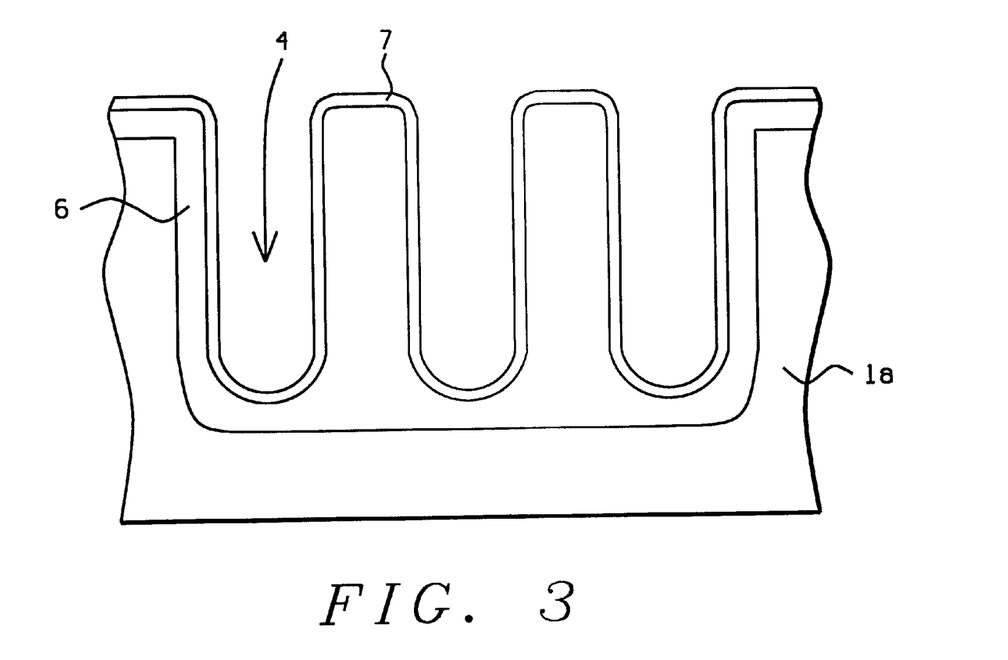
Figure 4:
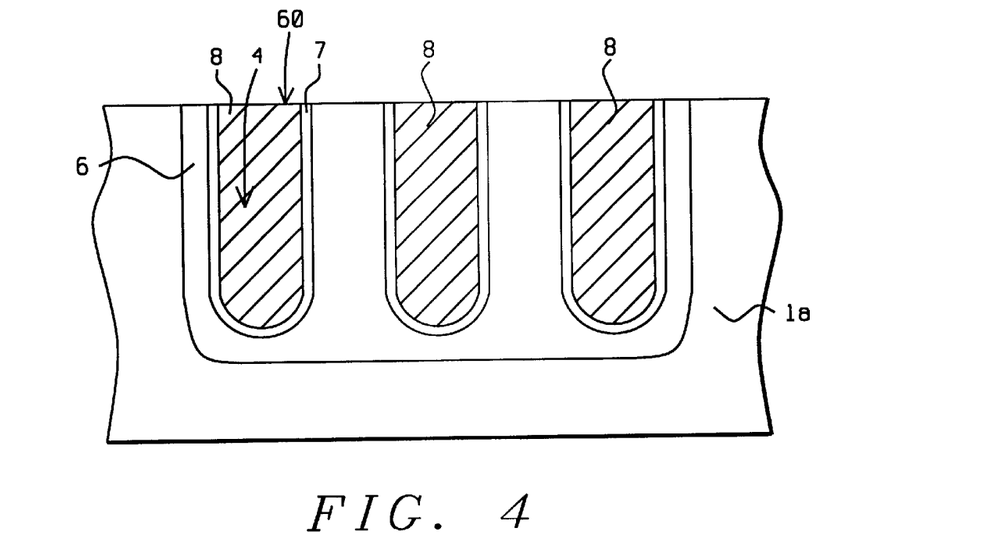
Figure 5:
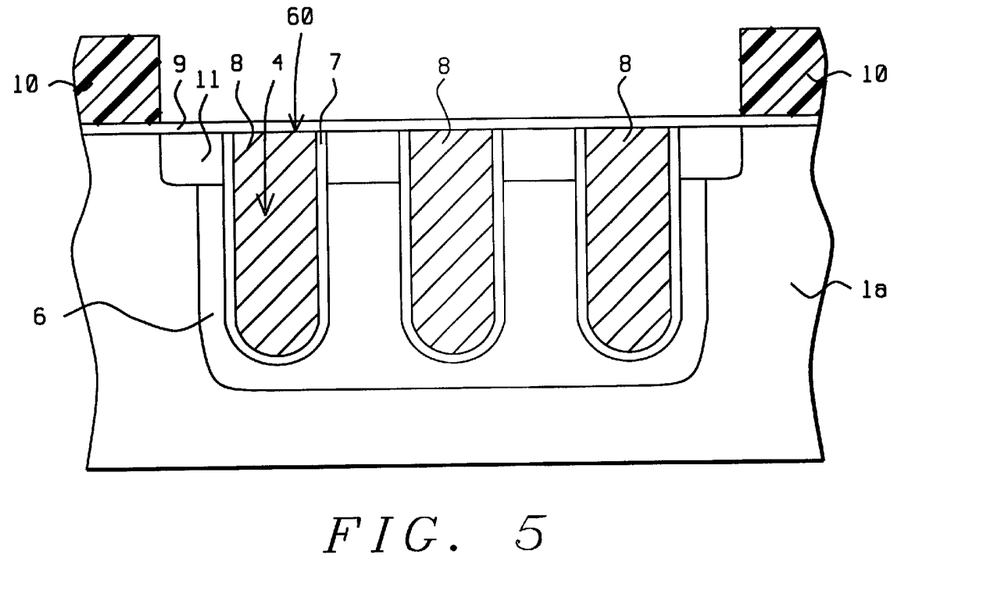

Node dielectric layer 7, comprised of silicon nitride and silicon oxide, is next formed at a thickness between about 35 to 45 Angstroms, on the exposed surfaces of deep, wide diameter trench shapes 4. Node dielectric layer 7, schematically shown in FIG. 3, is obtained via LPCVD procedures. Polysilicon layer 8, is next deposited via LPCVD procedures, to a thickness between about 2500 to 3000 Angstroms, completely filling deep, wide diameter trench shapes 4. Polysilicon layer 8, is doped in situ during deposition, via the addition of arsine to a silane ambient. Chemical mechanical polishing (CMP) procedures are then used to remove portions of polysilicon layer 8, and potions of node dielectric layer 7, from the top surface of semiconductor substrate 1$a$, resulting in deep, wide diameter trench capacitor structures 60, schematically shown in FIG. 4, comprised of the storage node plate, featuring polysilicon layer 8, node dielectric layer 7, and N type buried plate region 6. Silicon dioxide layer 9, is next obtained via thermal oxidation procedures, at a thickness between about 40 to 60 Angstroms. Photoresist shape 10, is then formed and used as a mask to allow arsenic ions to be implanted in a top portion of semiconductor substrate 1$a$, at an energy between about 100 to 200 KeV, and at a dose between about 2E12 to 4E13 atoms/$cm^2$. After removal of photoresist shape 10, via plasma oxygen ashing procedures, an anneal procedure is used to activate the implanted arsenic ions, resulting in the creation of buried N band region 11, schematically shown in FIG. 5.

Figure 6:
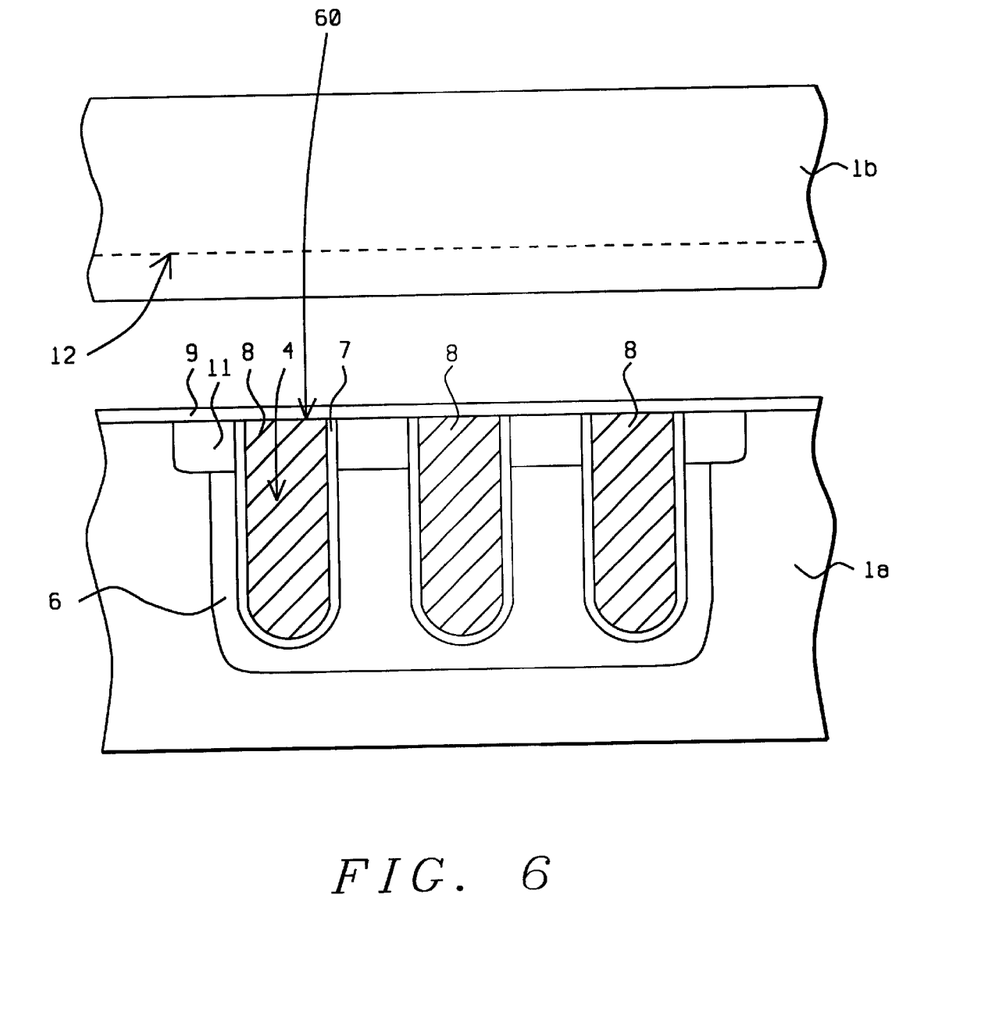

A second semiconductor substrate 1$b$, comprised of P type, single crystalline silicon, featuring a <100> crystallographic orientation, is next prepared for bonding to first semiconductor substrate 1$a$. This is schematically shown in FIG. 6. Prior to bonding an ion implantation procedure is applied to place either hydrogen, or oxygen ions, into a region of second semiconductor substrate 1$b$, to form splitting implant region 12, shown schematically in FIG. 6. Splitting implant region will subsequently be used to determine the extent the CMP procedure used to thin second semiconductor substrate 1$b$. The hydrogen or oxygen ions are implanted at an energy between about 10 to 30 KeV, using a dose between about 1.5E14 to 5E14 atoms/$cm^2$.

Figure 7:
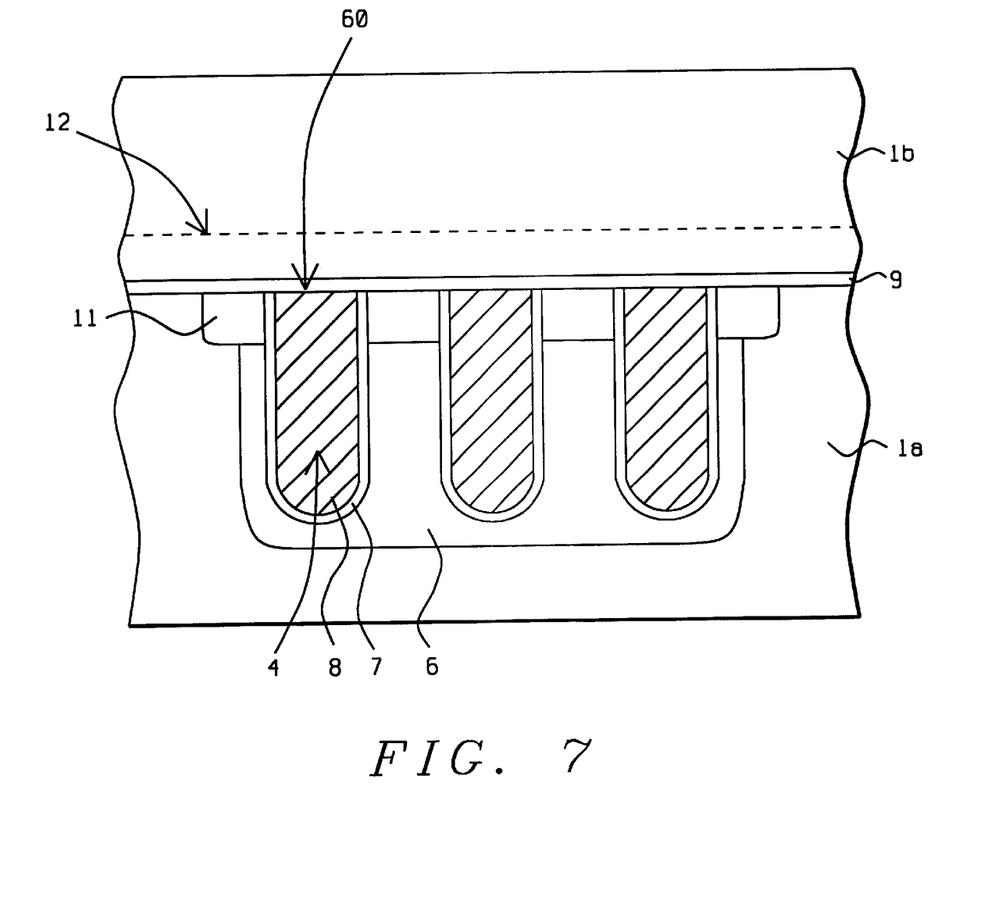
Figure 8:
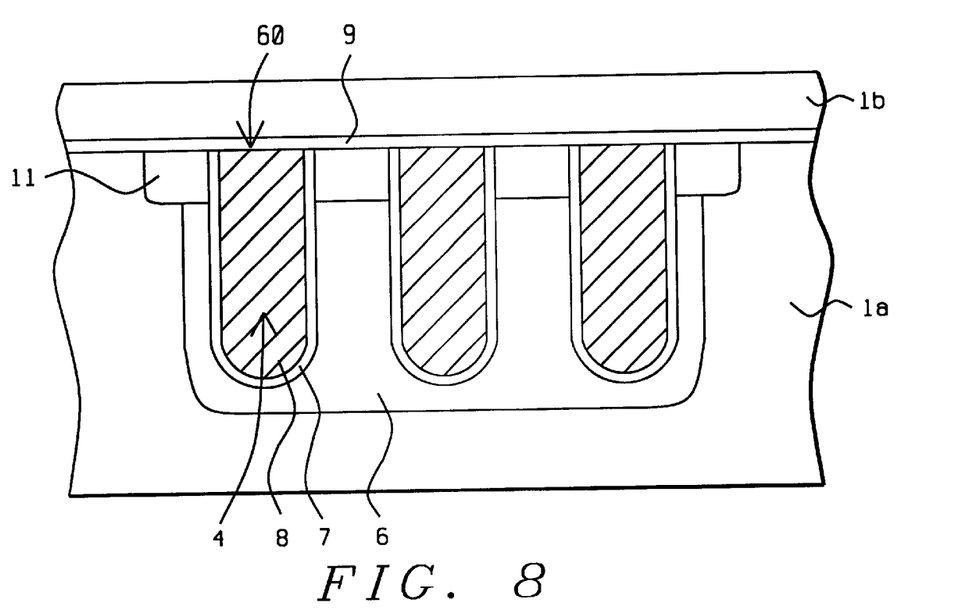

The bonding of semiconductor substrate 1$b$, to semiconductor substrate 1$a$, is next accomplished using SOI bonding type procedures. An anneal procedure is then performed at a temperature between about 800 to 900° C., for a time between about 10 to 15 min, in an inert ambient, for purposes of activating the implanted ions in splitting implant region 12, and to increase the probability of polishing back to that point. The result of these procedures is schematically shown in FIG. 7. A CMP procedure is now used to polish back the top portion of semiconductor substrate 1$b$, to a point in which splitting implant region 12, is exposed, with the CMP procedure terminating after removal of the splitting implant region. The thickness of thinned, second semiconductor substrate 1$b$, now remaining after the CMP procedure is between about 0.8 to 1.2 um. This is schematically shown in FIG. 8.

Figure 9:
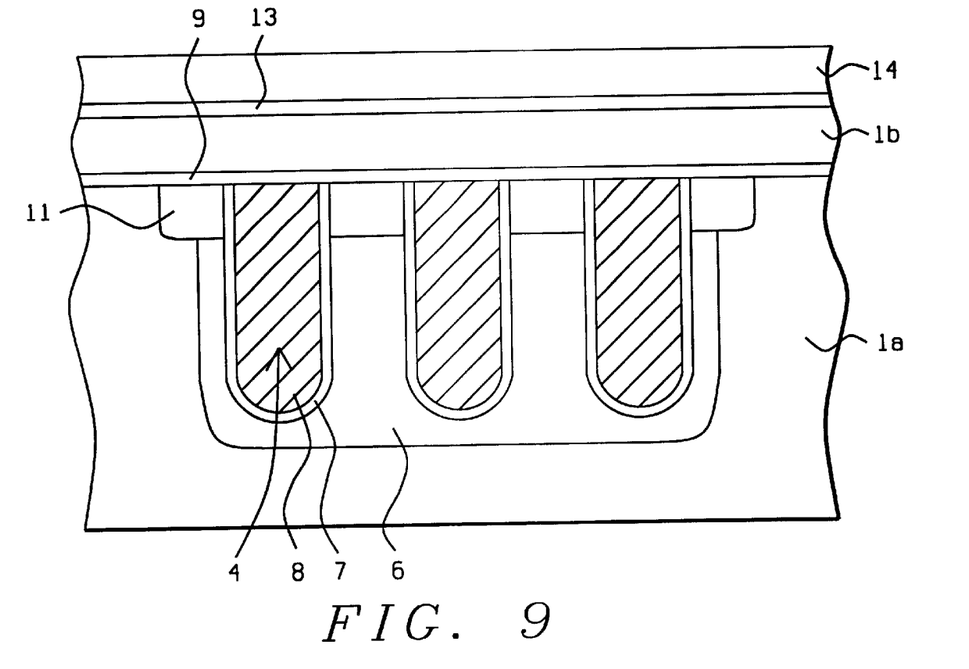

Thinned, second semiconductor substrate 1$b$, is next prepared for acceptance of a narrow diameter trench shape, enabling communication to deep, wide diameter trench capacitor structure 60, to be achieved. An oxidation procedure is first performed in an oxygen-steam ambient, to grow silicon dioxide layer 13, at a thickness between about 45 to 55 Angstroms, on the top surface of second semiconductor substrate 1$b$. An anneal procedure is then performed at a temperature between about 950 to 1050° C., to remove surface states at the silicon dioxide layer 13—second semiconductor substrate 1b, interface. This is followed by deposition of silicon nitride layer 14, at a thickness between about 1800 to 2000 Angstroms, via LPCVD or PECVD procedures. The result of these depositions are schematically shown in FIG. 9.

Figure 10:
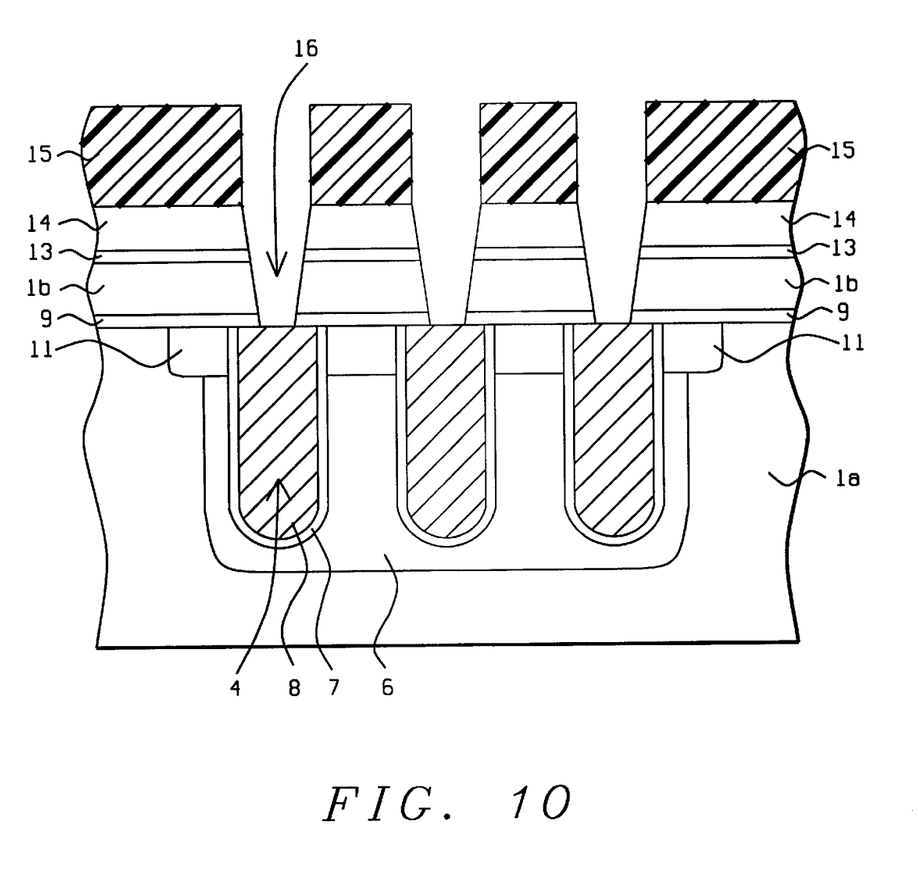

Photoresist shape 15, comprised with an underlying ARC layer, is then formed on the top surface of silicon nitride layer 14, and used as an etch mask to allow an anisotropic RIE procedure to define narrow diameter trench openings 16, in silicon nitride layer 14, in silicon dioxide layer 13, in second semiconductor 1b, and in silicon dioxide layer 9. The RIE procedure is performed using $CF_4$ as an etchant for silicon nitride, $CHF_3$ as an etchant for silicon dioxide, while a $Cl_2$—$SF_6$—$O_2$ ambient is used as an etchant for silicon. Narrow diameter trench openings 16, shown schematically in FIG. 10, are defined with a length between about 0.17 to 0.23 um, and with a width between about 0.10 to 0.16 um, each exposing a portion of a top surface of deep, wide diameter capacitor trench structures 60, located in first semiconductor substrate 1a. The taper angle of narrow diameter trench opening 16, a function of the ratio of components of the silicon etchant, is $\geq 90°$.

Figure 11A:
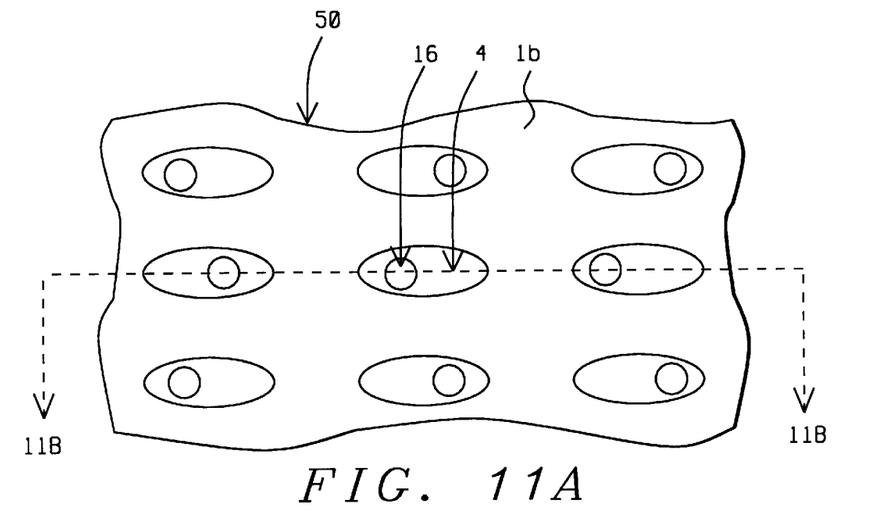
Figure 11B:
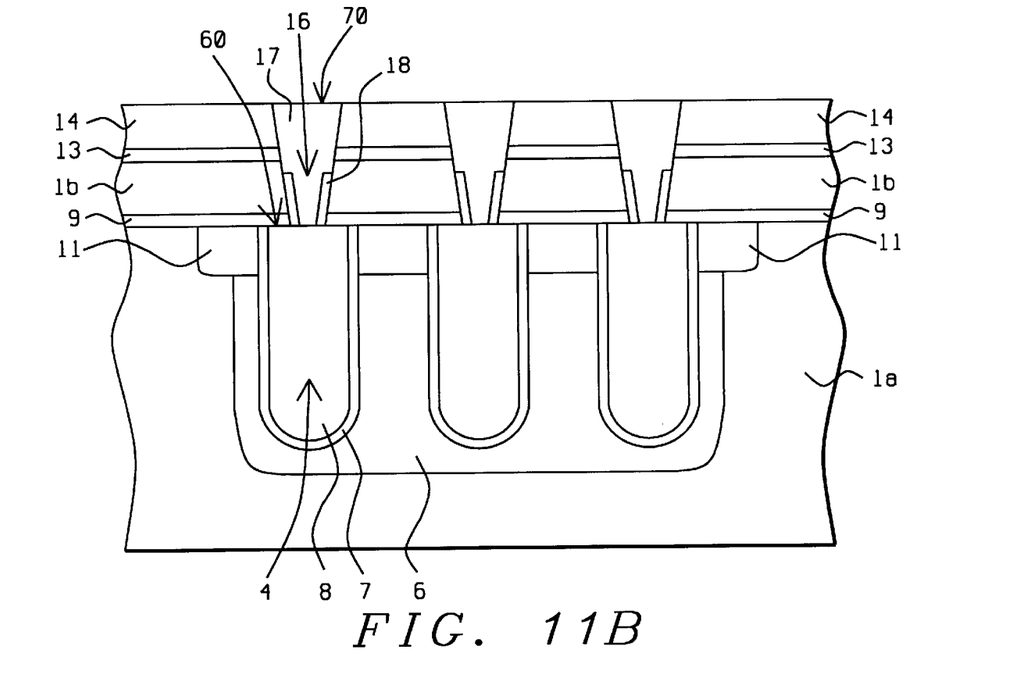

After removal of photoresist shape 15, via plasma oxygen ashing procedures, truncated collar oxide spacers 18, are formed on the sides of bottom portions of narrow diameter trench openings 16. First a silicon oxide layer is deposited at a thickness between about 150 to 250 Angstroms via LPCVD or PECVD procedures, completely contouring all surfaces of narrow diameter trench openings 16. After an anneal procedure performed at a temperature between about 800 to 900° C., in an inert ambient, an anisotropic RIE procedure, using $CHF_3$ as an etchant, is used to remove portions of the collar oxide layer from the top surface of silicon nitride layer 14, resulting in collar oxide spacers located on the sides of narrow diameter trench openings 16. Polysilicon layer 17, is next deposited via LPCVD procedures, at a thickness between about 2500 to 3000 Angstroms, completely filling narrow diameter trench openings 16. Polysilicon layer 17, is doped in situ, during deposition, via the addition of arsine to a silane ambient. A RIE procedure is then employed to remove regions of polysilicon layer 17, from the top surface of silicon nitride layer 14, as well as to recess polysilicon layer 17, in narrow diameter trench shape 16, to a level between about 1000 to 1500 Angstroms below the top surface of thinned, second semiconductor substrate 1b. The portions of the collar oxide spacers, now exposed in the top portion of narrow diameter trench openings 16, are the selectively removed via RIE procedures, resulting in truncated collar oxide spacers 18, located on the sides of bottom portions of narrow diameter openings 16. This is schematically shown in cross-sectional style, in FIG. 11B.

Narrow diameter trench openings are then refilled with an arsenic doped, polysilicon layer, followed by removal of the portions of the refilling polysilicon layer which reside on the top surface of silicon nitride layer 14. The result of these procedures, shown schematically in cross-sectional style in FIG. 11B, features the formation of narrow diameter trench structures 70, comprised of polysilicon layer 17, and polysilicon fill, in the narrow diameter trench openings 16, with the polysilicon components butting truncated collar oxide spacers 18, and of greatest importance each narrow diameter trench structure 70, overlying and contacting a top portion of deep, wide diameter trench capacitor structure 60. This combination, shown schematically as a top view in FIG. 1A, allows the size of DRAM cell 50, to be minimized, as a result of obtaining the desired high capacitance via use of buried, deep, wide diameter trench capacitor structure 60, accessed via overlying, narrow diameter trench structure 70. This allows the space in thinned, second semiconductor substrate 1b, not occupied by narrow diameter trench structures 70, to be used for other DRAM components such as the transfer gate transistor. The formation of the transfer gate transistor, shallow trench isolation regions, bit lines, etc, all formed in unoccupied regions of second semiconductor substrate 1b, are not described or shown in the drawings.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating trench capacitor structures for a dynamic random access memory (DRAM) cell, comprising the steps of:

forming deep, wide diameter trench openings in a first semiconductor structure;

forming a buried plate region in an area of said first semiconductor structure encompassing said deep, wide diameter trench openings;

forming a node dielectric layer on exposed surfaces of said deep, wide diameter trench openings;

forming a conductive storage node plate structure in said deep, wide diameter trench openings resulting in deep, wide diameter trench capacitor structures in a top portion of said first semiconductor substrate, with each deep, wide diameter capacitor structure comprised of said storage node plate structure, of said node dielectric layer, and of said buried plate region;

forming a splitting anneal region in a top portion of a second semiconductor substrate;

bonding a second semiconductor substrate to said first semiconductor substrate, at a temperature between about 800 to 900° C., for a time between about 10 to 15 mm., in an inert ambient, with said top portion of said second semiconductor substrate bonded to top surface of said first semiconductor substrate;

performing a chemical mechanical polishing procedure to remove bottom portion of said second semiconductor substrate, terminating at said splitting implant region, resulting in a thinned second semiconductor substrate, overlying said top surface of said first semiconductor substrate;

forming narrow diameter trench structures in first portions of said thinned second semiconductor substrate, overlying and contacting top portions of said deep, wide diameter capacitor structures, wherein said narrow diameter trench structures comprise truncated collar silicon dioxide spacers; and forming DRAM transfer gate transistor elements in said second portions of said thinned second semiconductor substrate.

2. The method of claim 1, wherein said first semiconductor substrate is a P type single crystalline silicon substrate, comprised with a <100> crystallographic orientation.

3. The method of claim 1, wherein the depth of said deep, wide diameter trench openings, in said first semiconductor substrate, is between about 6.5 to 7.5 um.

4. The method of claim 1, wherein said deep, wide diameter trench openings are comprised with a length between about 0.25 to 0.35 um, and with a width between about 0.15 to 0.25 um.

5. The method of claim 1, wherein said buried plate region is an N type region, formed via out diffusion from an arsenic silica glass (ASG) layer, located on the surfaces of said deep, wide diameter trench shapes, via an anneal procedure performed at a temperature between about 950 to 1050° C., in an inert ambient.

6. The method of claim 1, wherein said node dielectric layer is comprised of silicon nitride and silicon oxide, obtained via LPCVD procedures, at a thickness between about 35 to 45 Angstroms.

7. The method of claim 1, wherein said conductive storage node plate structure is an arsenic doped polysilicon structure, located in said deep, wide diameter trench openings, formed via deposition of a polysilicon layer via LPCVD procedures, and doped in situ during deposition via the addition of arsine to a silane ambient, then defined via chemical mechanical polishing (CMP) procedures.

8. The method of claim 1, wherein said second semiconductor substrate is a P type single crystalline silicon substrate, comprised with a <100> crystallographic orientation.

9. The method of claim 1, wherein said splitting implant region is formed in said second semiconductor substrate, via implantation of hydrogen or oxygen ions, at an energy between about 10 to 30 KeV, at a dose between about 1.5E14 to 5E14 atoms/cm$^2$.

10. The method of claim 1, wherein narrow diameter trench openings, used for formation of said narrow diameter trench structures, are defined in said thinned second semiconductor substrate via RIE procedures, using $Cl_2$—$SF_6$—$O_2$ as an etchant for silicon.

11. The method of claim 1, wherein narrow diameter trench openings for said narrow diameter trench structures are comprised with a width between about 0.10 to 0.16 um, and comprised with a length between about 0.17 to 0.23 um.

12. The method of claim 1, wherein said narrow diameter trench structures are filled with arsenic doped polysilicon.

13. A method of fabricating trench capacitor structures for a dynamic random access memory (DRAM) cell, featuring deep, wide diameter trench capacitor structures, located in an underlying, first semiconductor substrate, and contacted by narrow diameter trench structures, located in an overlying second semiconductor substrate, comprising the steps of:

forming deep, wide diameter trench openings in said first semiconductor structure;

depositing an N type doped glass layer, covering all surfaces of said deep, narrow diameter trench openings;

performing an anneal procedure to drive N type dopants from said N type doped glass layer to said first semiconductor substrate forming an N type buried plate region in an area of said first semiconductor structure encompassing said deep, wide diameter trench openings;

forming a node dielectric layer on exposed surfaces of said deep, wide diameter trench openings;

forming polysilicon storage node structures in said deep, wide diameter trench openings resulting in said deep, wide diameter trench capacitor structures in a top portion of said first semiconductor substrate, with each deep, wide diameter trench capacitor structure comprised of a polysilicon storage node structure, of said node dielectric layer, and of an N type buried plate region;

forming a splitting anneal region in a top portion of a second semiconductor substrate;

performing a bonding procedure to bond said top portion of said second semiconductor substrate to a top surface of said first semiconductor substrate;

performing a chemical mechanical polishing procedure to remove a portion of said second semiconductor substrate, with said chemical mechanical polishing procedure terminating at, the removing said splitting implant region, resulting in a thinned second semiconductor substrate, overlying said top surface of said first semiconductor substrate;

forming narrow diameter trench openings in said thinned second semiconductor substrate with each narrow diameter trench opening exposing a top portion of said deep, wide diameter trench capacitor structure;

forming a collar oxide spacer on the sides of said narrow diameter trench openings;

filling said narrow diameter trench openings with a first polysilicon layer;

recessing said first polysilicon layer in said narrow diameter trench openings, exposing top portions of said collar oxide spacers;

selectively removing exposed top portions of said collar oxide spacers, resulting in truncated collar oxide spacers located on the sides of bottom portions of said narrow diameter trench openings; and refilling recessed portion of said narrow diameter trench openings with a second polysilicon layer, creating said narrow trench structures, with each said narrow diameter trench structure overlying and contacting a top portion of a deep, wide diameter capacitor trench structure.

14. The method of claim 13, wherein said first semiconductor substrate is a P type single crystalline silicon substrate, comprised with a <100> crystallographic orientation.

15. The method of claim 13, wherein the depth of said deep, wide diameter trench openings, in said first semiconductor substrate, is between about 6.5 to 7.5 um.

16. The method of claim 13, wherein said deep, wide diameter trench openings are comprised with a length between about 0.25 to 0.35 um, and with a width between about 0.15 to 0.25 um.

17. The method of claim 13, wherein said N type doped glass layer is a arsenic silica glass (ASG) layer, obtained via LPCVD or PECVD procedures, at a thickness between about 250 to 400 Angstroms.

18. The method of claim 13, wherein said anneal procedure, used to form said N type buried plate region via diffusion from an ASG layer, is performed at a temperature between about 950 to 1050° C., in an inert ambient.

19. The method of claim 13, wherein said node dielectric layer is comprised of silicon nitride and silicon oxide, obtained via LPCVD procedures, at a thickness between about 35 to 45 Angstroms.

20. The method of claim 13, wherein said polysilicon storage node structures are obtained via deposition of a polysilicon layer using LPCVD procedures, and doped in situ during deposition via the addition of arsine to a silane ambient, then defined via chemical mechanical polishing (CMP) procedures.

21. The method of claim 13, wherein said second semiconductor substrate is a P type single crystalline silicon substrate, comprised with a <100> crystallographic orientation.

22. The method of claim 13, wherein said splitting implant region is formed in said second semiconductor substrate, via implantation of hydrogen or oxygen ions, at an energy between about 10 to 35 KeV, at a dose between about 1.5E14 to SE14 atoms/cm$^2$.

23. The method of claim 13, wherein the top surface of said second semiconductor substrate is bonded to said top surface of said first semiconductor substrate, via an anneal procedure performed at a temperature between about 800 to 900° C., for a time between about 10 to 15 mm., in an inert ambient.

24. The method of claim 13, wherein narrow diameter trench openings are defined in said thinned second semiconductor substrate via an anisotropic RIE procedure using $Cl_2$—$SF_6$—$O_2$ as an etchant for silicon, with said narrow diameter trench openings formed at an angle of $\geq 90°$.

25. The method of claim 13, wherein narrow diameter trench openings are comprised with a width between about 0.10 to 0.16 um, and comprised with a length between about 0.17 to 0.23 um.

26. The method of claim 13, wherein said truncated collar spacers are comprised of silicon oxide, at a thickness between about 150 to 250 Angstroms.

27. The method of claim 13, wherein said first polysilicon layer, and said second polysilicon layer, used to fill said narrow diameter trench openings, are comprised of arsenic doped polysilicon, obtained via LPCVD procedures, and doped in situ, during deposition, via the addition of arsine to a silane ambient.

* * * * *